US012598700B2

(12) United States Patent
Sano et al.

(10) Patent No.: US 12,598,700 B2
(45) Date of Patent: Apr. 7, 2026

(54) WIRING BOARD

(71) Applicant: KYOCERA CORPORATION, Kyoto (JP)

(72) Inventors: Hiroaki Sano, Kagoshima (JP); Toshifumi Higashi, Kirishima (JP); Akira Imoto, Kirishima (JP); Takafumi Yamaguchi, Kirishima (JP); Sentarou Yamamoto, Kagoshima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 18/852,918

(22) PCT Filed: Mar. 8, 2023

(86) PCT No.: PCT/JP2023/008933
§ 371 (c)(1),
(2) Date: Sep. 30, 2024

(87) PCT Pub. No.: WO2023/189338
PCT Pub. Date: Oct. 5, 2023

(65) Prior Publication Data
US 2025/0220813 A1      Jul. 3, 2025

(30) Foreign Application Priority Data

Mar. 30, 2022    (JP) ................................. 2022-057452

(51) Int. Cl.
*H05K 1/09* (2006.01)
*H05K 1/03* (2006.01)

(52) U.S. Cl.
CPC ........... *H05K 1/092* (2013.01); *H05K 1/0306* (2013.01); *H05K 2201/0209* (2013.01); *H05K 2201/0215* (2013.01); *H05K 2201/0242* (2013.01); *H05K 2201/0263* (2013.01); *H05K 2201/0338* (2013.01)

(58) Field of Classification Search
CPC . H05K 1/0306; H05K 2201/0338; H05K 3/38
See application file for complete search history.

(56) References Cited

U.S. PATENT DOCUMENTS

2016/0338201 A1    11/2016   Kiyono et al.

FOREIGN PATENT DOCUMENTS

| | | | | |
|---|---|---|---|---|
| JP | 2002-043756 A | | 2/2002 | |
| JP | 2003-277852 A | | 10/2003 | |
| JP | 2004-134378 A | | 4/2004 | |
| JP | 2008-34551 A | | 2/2008 | |
| JP | 2008034551 A | * | 2/2008 | .............. H05K 1/09 |
| JP | 2008-159726 A | | 7/2008 | |
| WO | 2015/118982 A1 | | 8/2015 | |

* cited by examiner

*Primary Examiner* — Khanh T Nguyen
(74) *Attorney, Agent, or Firm* — Volpe Koenig

(57) ABSTRACT

The wiring board includes an insulation layer made of ceramic and a conductor layer extending in a planar direction inside the insulation layer. The conductor layer is constituted by a sintered body of a plurality of crystallites containing a metal as a main component, and has a layered structure in which a dense layer, a non-dense layer, and a dense layer are layered in layers in this order in a thickness direction.

6 Claims, 2 Drawing Sheets

WIRING BOARD

CROSS-REFERENCE TO RELATED APPLICATIONS

This application is national stage application of International Application No. PCT/JP2023/008933, filed on Mar. 8, 2023, which designates the United States, incorporated herein by reference, and which claims the benefit of priority from Japanese Patent Application No. 2022-057452, filed on Mar. 30, 2022, the entire contents of which are incorporated herein by reference.

TECHNICAL FIELD

An embodiment of the present disclosure relates to a wiring board.

BACKGROUND OF INVENTION

Conventionally, a wiring board including an insulation layer containing ceramic as a main component and a conductor layer containing metal as a main component has been known. Such a wiring board is obtained by, for example, simultaneously firing a conductive material in which a metal oxide is added to copper powder and glass ceramic as an insulation layer material (for example, see Patent Document 1).

CITATION LIST

Patent Literature

Patent Document 1: JP 2003-277852 A

SUMMARY

A wiring board of the present disclosure includes an insulation layer made of ceramic, and a conductor layer extending in a planar direction inside the insulation layer. The conductor layer is constituted by a sintered body of a plurality of crystallites containing a metal as a main component, and has a layered structure in which a dense layer, a non-dense layer, and a dense layer are layered in layers in this order in a thickness direction.

DESCRIPTION OF EMBODIMENTS

Hereinafter, embodiments of a wiring board disclosed in the present application will be described with reference to the accompanying drawings. The present disclosure is not limited by the following embodiments. Embodiments can be appropriately combined so as not to contradict each other in terms of processing content. In the following embodiments, the same portions are denoted by the same reference signs, and redundant explanations are omitted.

In the embodiments described below, expressions such as "parallel" may be used, but these expressions do not need to be strictly "parallel". That is, the above-described expressions allow deviations in manufacturing accuracy, installation accuracy, and the like, for example.

Conventionally, a wiring board including an insulation layer containing ceramic as a main component and a conductor layer containing metal as a main component has been known. Such a wiring board is obtained, for example, by simultaneously firing a conductive material in which a metal oxide is added to copper powder and glass ceramic as an insulation layer material.

However, in the related art, for example, when the adhesion between the insulation layer and the conductor layer is not sufficient, the insulation layer and the conductor layer may be separated from each other. Realization of a technique capable of overcoming the above-described problems and reduction of peeling between the insulation layer and the conductor layer in the wiring board is expected.

Figure 1:
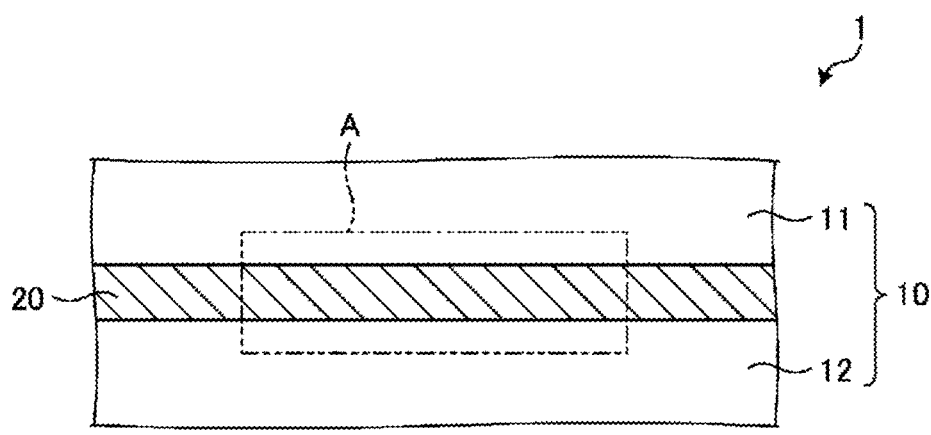
FIG. 1 is an enlarged cross-sectional view illustrating an example of a configuration of a wiring board according to an embodiment.
Figure 2:
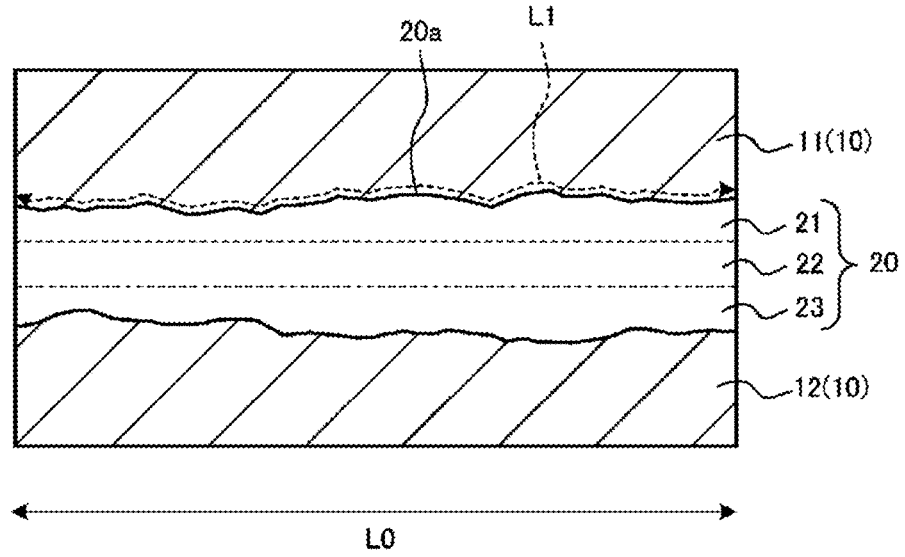
FIG. 2 is an enlarged view of a region A illustrated in FIG. 1.

FIG. 1 is an enlarged cross-sectional view illustrating an example of a wiring board 1 according to the embodiment, and FIG. 2 is an enlarged view of a region A illustrated in FIG. 1. As illustrated in FIGS. 1 and 2, the wiring board 1 according to the embodiment includes an insulation layer 10 and a conductor layer 20.

The insulation layer 10 may be, for example, a glass ceramic sintered body. Ceramics such as aluminum oxide, aluminum nitride, silicon carbide, silicon nitride, or mullite may be contained as a filler.

The insulation layer 10 may be made of, for example, glass ceramic. Thus, the wiring board 1 can be manufactured by simultaneously firing the green sheet, which is the raw material of the insulation layer 10, and the conductive paste, which is the raw material of the conductor layer 20. Thus, according to the embodiment, the manufacturing cost of the wiring board 1 can be reduced.

The insulation layer 10 may include a first layer 11 and a second layer 12 that face each other with the conductor layer 20 interposed therebetween. For example, the first layer 11 and the second layer 12 are located to sandwich both surfaces of the conductor layer 20 in the thickness direction.

The conductor layer 20 has electrical conductivity and extends in a planar direction (a lateral direction in FIG. 1) inside the insulation layer 10. For example, the conductor layer 20 is disposed in a predetermined pattern shape between the first layer 11 and the second layer 12. In the present disclosure, the conductor layer 20 may be exposed on the surface of the wiring board 1.

Figure 4:
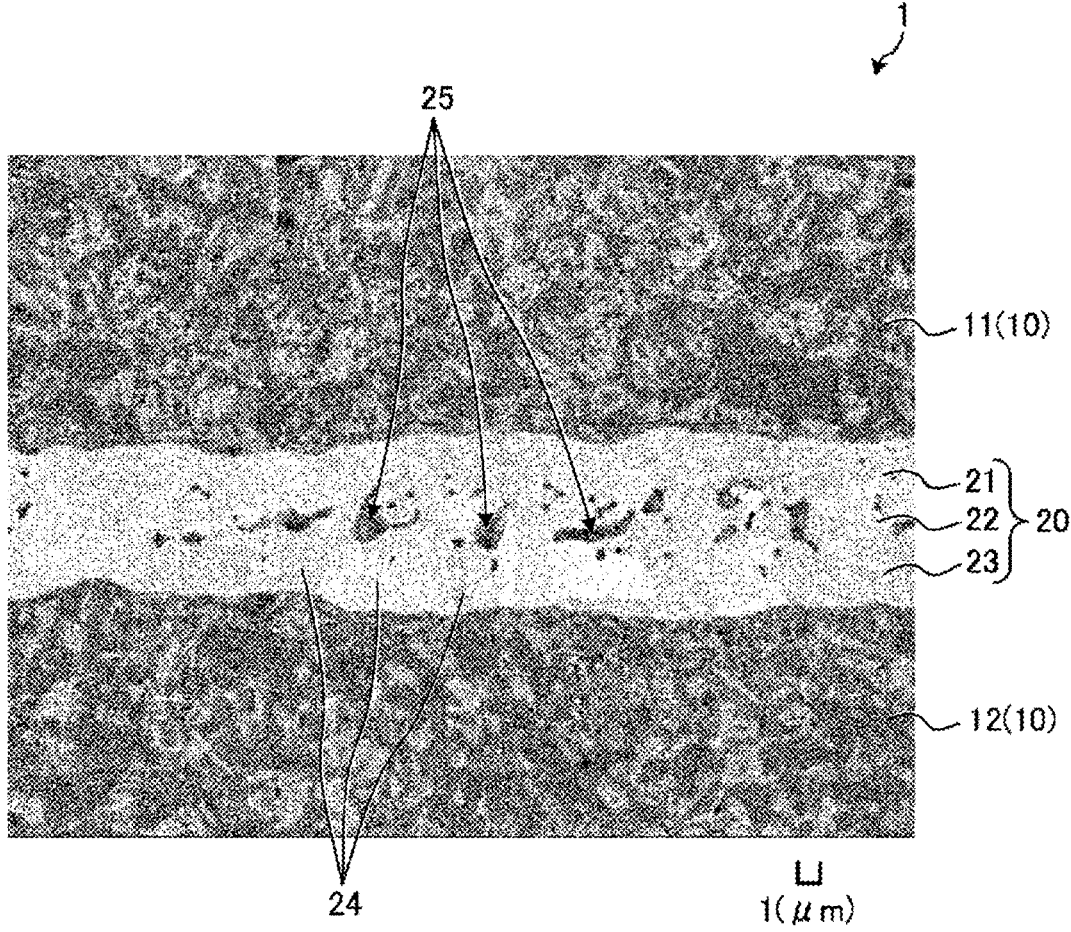
FIG. 4 is a view illustrating an SEM observation photograph of a conductor layer according to an example.

The conductor layer 20 is constituted by a sintered body of a plurality of crystallites 24 (see FIG. 4). The crystallite 24 is made of a metal material such as copper, silver, palladium, gold, platinum-tungsten, molybdenum, or manganese, or an alloy material or a mixed material containing any of these metal materials as a main component.

Here, in the embodiment, as illustrated in FIG. 2, the conductor layer 20 has a layered structure in which a dense layer 21, a non-dense layer 22, and a dense layer 23 are layered in layers in this order in the thickness direction (the vertical direction in FIG. 2).

The non-dense layer 22 has a plurality of voids 25 (see FIG. 4) and is less dense than the dense layers 21 and 23. On the other hand, the dense layers 21 and 23 have almost no voids 25 and are denser than the non-dense layer 22.

Thus, even if a stress is generated between the conductor layer 20 and the insulation layer 10 due to a difference in Young's modulus or thermal expansion coefficient between the conductor layer 20 and the insulation layer 10, the stress can be relaxed in the portion of the non-dense layer 22 because the apparent Young's modulus of the non-dense layer 22 is low (that is, the apparent rigidity is low).

Therefore, according to the embodiment, peeling between the insulation layer 10 and the conductor layer 20 can be reduced.

In the embodiment, when a certain range (for example, the region A) of the conductor layer 20 is specified in a cross-sectional view, L1/L0 may be in a range of 1.04 to 1.14, where L0 is a linear length in a planar direction (horizontal direction in FIG. 2), and L1 is a length of a contour 20a of the conductor layer 20 (that is, an interface length between the conductor layer 20 and the insulation layer 10).

As described above, in the embodiment, the interface electrical conductivity of the conductor layer 20 can be increased by making the unevenness of the contour 20a of the conductor layer 20 relatively small.

In the embodiment, the sintered body constituting the conductor layer 20 may include nano-sized silica particles (not illustrated). The silica particles may be located on the surface of the crystallite 24. In other words, in the wiring board 1, silica may be present on the surface of the conductor layer 20 in a particulate state.

Here, the "surface of the conductor layer 20" refers to the vicinity of the interface between the insulation layer 10 and the conductor layer 20 when the conductor layer 20 is formed on the surface of the insulation layer 10. The "vicinity of the interface" includes a range of a slight width from the surface of the conductor layer 20 to the inside of the conductor layer 20. The "slight width" is, for example, a range within 1 μm from the surface of the conductor layer 20.

In the embodiment, the adhesion between the conductor layer 20 and the insulation layer 10 can be increased by the presence of the nano-sized silica particles on the surface of the conductor layer 20. The silica particles may be present on the entire surface of the conductor layer 20 facing the insulation layer 10, or may be present on only a portion of the surface of the conductor layer 20. In the case where a plurality of silica particles are present on the surface of the conductor layer 20, these silica particles may be present so as to be isolated from each other.

One of the reasons why the adhesion between the insulation layer 10 and the conductor layer 20 is enhanced by the presence of the silica particles on the surface of the conductor layer 20 or in the vicinity of the interface between the insulation layer 10 and the conductor layer 20 is considered to be that the shrinkage behavior of a metal material (for example, copper) used for the conductor layer 20 during firing is close to the shrinkage behavior of the silica particles.

The reason why the shrinkage behavior of the metal material used for the conductor layer 20 at the time of firing is close to the shrinkage behavior of the silica particles is considered to be that the size of the silica particles is minute (nano-size).

If silica particles larger than the nano size are used, the particle size distribution based on the size is broadened, and the heat capacity due to the size is increased. These factors change the sintering behavior and the adhesion.

When the glass powder of the composite oxide is used instead of the nano-sized silica particles, the glass powder contains a plurality of components, and thus the range of the temperature at which the glass powder is in a molten state is wider than that in the case of the nano-sized silica particles.

For example, in the case of glass powder, the melting temperature may start at a lower temperature than in the case of nano-sized silica particles. The glass powder may often have a wide particle size distribution. When glass powder having these properties is used, the glass powder is likely to aggregate or move due to sintering in the printed pattern to be the conductor layer 20 during firing.

As a result, when the conductor layer 20 is formed, the metal particles are likely to grow, and voids are likely to be generated in the conductor layer 20. This is because the glass powder is easily diffused from the portion of the printed pattern to the region to be the insulation layer 10.

On the other hand, when the nano-sized silica particles are used, the temperature range in which the silica particles are in a molten state is narrower than that in the case of the glass powder because the silica particles have a single composition. As a result, the conductor layer 20 becomes dense, and a recess having a gentle shape is easily formed on the surface along the insulation layer 10.

The silica particles according to the embodiment may have an average particle diameter of 1 (nm) to 50 (nm). Among these, silica particles having an average particle diameter of 20 (nm) are preferable. In the silica particles, the ratio of the integrated amount of the lower limit of 10 (nm) and the upper limit of 30 (nm) is preferably 70(%) or more.

As will be described later, the disclosed conductor layer 20 is formed using composite powder obtained by mixing silica particles and glass powder of a composite oxide with metal powder as a solid content of a conductor paste. In this case, the silica particles tend to be present on the conductor layer 20 side in the vicinity of the interface between the conductor layer 20 and the insulation layer 10, but the glass powder of the composite oxide is not found in the conductor layer 20. The glass powder of the composite oxide is considered to be diffused from the conductor layer 20 to the insulation layer 10 side during firing. Thus, the non-dense layer 22 in the conductor layer 20 is considered to be a portion where the glass powder of the composite oxide was originally present.

Each of the dense layers 21 and 23 has a band-like portion having no void 25 in the planar direction of the conductor layer 20. In particular, the voids 25 are hardly observed in a range of 2 (μm) or less from the interface with the insulation layer 10. The ratio of the area of the voids 25 is preferably 3% or less when the area of one of the dense layers 21 and 23 in a predetermined length is defined as 100(%). A non-dense layer 22 is sandwiched between a dense layer 21 in which the area ratio of voids 25 is 3(%) or less and a dense layer 23 in which the area ratio of voids 25 is 3(%) or less.

The ratio of the voids 25 in the non-dense layer 22 is preferably 5(%) or more and 40(%) or less when the area in a predetermined length is defined as 100(%). In this case, when the measurement is performed by further dividing the predetermined length, the non-dense layer 22 may be in a state in which a portion having a porosity of 5(%) or more and 10(%) or less, a portion having a porosity of more than 10(%) and 30(%) or less, and a portion having a porosity of more than 30(%) and 40(%) or less are distributed in the planar direction.

As a method of distinguishing the dense layer 21 and the dense layer 23 from the non-dense layer 22 in the conductor layer 20, it is preferable to use a difference in porosity of each portion. In this case, the difference in porosity between the dense layer 21, the dense layer 23, and the non-dense layer 22 may be set to 2(%) or more. The difference in porosity may be 5(%) or more, or 10(%) or more. For example, the dense layer 21 and the dense layer 23 have a porosity of 3(%) or less. On the other hand, the non-dense layer 22 is located at the center in the thickness direction of the conductor layer 20 and has a porosity of 5(%) or more.

When the dense layer 21, the dense layer 23, and the non-dense layer 22 are identified from the conductor layer 20, the conductor layer 20 may be simply divided into three equal parts in the thickness direction. The dense layers 21 and 23 and the non-dense layer 22 may be visually specified by applying a straight line parallel to the main surface of the insulation layer 10 to an arbitrary position so as to be parallel to the conductor layer 20 as it is. In this case, the difference in thickness between the dense layers 21 and 23 located above and below the non-dense layer 22 is preferably 1 (μm) or less.

In the embodiment, the crystallite 24 may be configured to have copper as a main component, and the plurality of crystallites 24 may include a crystallite 24 having a polygonal shape including a linear side, and the crystallites 24 may be in contact with each other along the side as a grain boundary. As a result, the interface electrical conductivity in a high-frequency region can be increased, and thus the wiring board 1 having a high interface electrical conductivity in a high-frequency region can be obtained.

Figure 3:
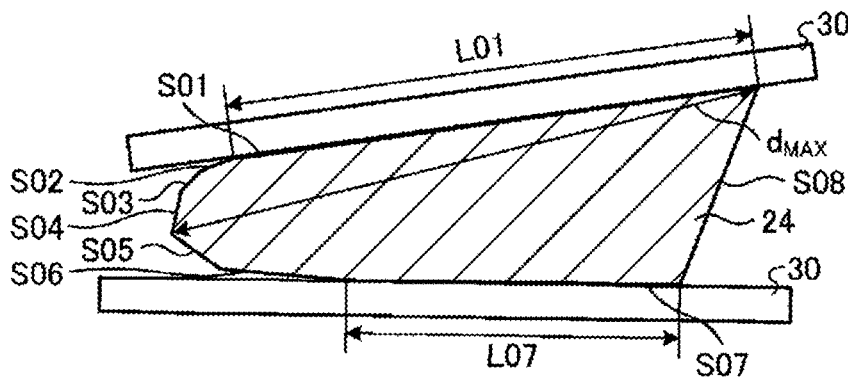
FIG. 3 is an explanatory diagram illustrating an evaluation method for crystallites.

Here, a method for evaluating the "linear side" of the crystallite 24 will be described with reference to FIG. 3. FIG. 3 is an explanatory view illustrating a method of evaluating the crystallite 24. As illustrated in FIG. 3, the crystallite 24 has a polygonal cross section. As an example, the crystallite 24 illustrated in FIG. 3 has an octagonal contour having sides S01 to S08.

For an image obtained by photographing the conductor layer 20 including such a cross section, for example, a scale (or a ruler) 30 is prepared and located along the side SOL. The side S01 is defined as a "linear side" when a length of a portion along the scale (or ruler) 30 is equal to or longer than ½ of the longest dimension $d_{MAX}$ of the crystallite 24.

The other sides S02 to S08 are also evaluated as to whether or not they are each a "linear side", similarly to the side SOL. In the example illustrated in FIG. 3, the side S01 having the length L01 and the side S07 having the length L07 are evaluated as a "linear side". That is, the crystallite 24 illustrated in FIG. 3 has two "linear sides". The longest diameter $d_{MAX}$ of the crystallite 24 may be 1 (μm) or more and 10 (μm) or less.

For example, for the conductor layer 20 according to the embodiment, the above-described evaluation is repeated for each side of each of the plurality of crystallites 24. In such a case, the plurality of crystallites 24 may include the crystallites 24 having two or more linear sides at a number ratio of 70(%) or more.

In this manner, in the wiring board 1 including the conductor layer 20 in which the number ratio of the crystallites 24 having two or more linear sides is 70(%) or more, a decrease in interface electrical conductivity in a high-frequency region can be reduced (for example, 1 (GHz) to 49 (GHz)). Therefore, according to the embodiment, the interface electrical conductivity of the conductor layer 20 in the high-frequency region can be increased.

EXAMPLES

An example of the present disclosure will be specifically described below. In addition, in examples described below, a wiring board including an insulation layer made of glass ceramic and a conductor layer containing copper as a main component will be described, but the present disclosure is not limited to the following Examples.

Example

First, as a material of the insulation layer, a mixture of alumina particles 40 (wt %) and borosilicate glass 60 (wt %) was prepared. Such a mixture is a glass ceramic raw material having a firing temperature of 900 (° C.) to 1000 (° C.).

As an organic binder, 20 (parts by mass) of isobutyl methacrylate resin and dibutyl phthalate were used per 100 (parts by mass) of the glass ceramic raw material, and a green sheet having a thickness of 100 (μm) was produced by doctor blade molding.

Copper powder (purity: 99.9 (wt %)) having an average particle diameter of 2 (μm), silica particles having an average particle diameter of 20 (nm), and borosilicate glass powder having an average particle diameter of 2 (μm) were prepared as raw materials for the conductor layer. The silica particles had a proportion of the integrated amount of the lower limit of 10 (nm) and the upper limit of 30 (nm) of 70(%) or more.

The amount of the silica particles added was 1 (part by mass) (that is, the content of the silica particles was 1 (wt %)) with respect to 100 (parts by mass) of the copper powder. The amount of the glass powder added was 1 part by mass relative to 100 parts by mass of the copper powder (i.e., the content of the glass powder was 1 wt %).

As the organic binder, isobutyl methacrylate resin and a mixed solvent of butyl carbitol acetate and dibutyl phthalate were used. Isobutyl methacrylate resin was added at a ratio of 5 (parts by mass) with respect to 100 (parts by mass) of the copper powder, and a mixed solvent of butyl carbitol acetate and dibutyl phthalate was further added to prepare a conductor paste containing the copper powder, the silica particles, and the glass powder.

A conductor paste was printed on both surfaces of the prepared green sheet in a predetermined area and fired. The firing was performed in a reducing atmosphere using a hydrogen-nitrogen mixed gas at a maximum temperature of 930 (° C.) for a retention time of 2 hours. A plurality of green sheets were layered to a thickness of 500 (μm). In this manner, the wiring board 1 of Example was obtained.

Reference Example

The wiring board 1 of Reference Example was obtained by the same or similar method and conditions as those of the above-described Example, except for the composition of the conductive paste in the step of preparing the conductor paste.

In Reference Example, silica particles were not added in the step of producing the conductor paste. The amount of the glass powder added was 1 part by mass relative to 100 parts by mass of the copper powder (i.e., the content of the glass powder was 1 wt %).

Various Evaluations

The wiring board 1 of Example and Reference Example obtained as described above were cut, the cut surfaces were mirror-polished, and the cross sections were observed by a scanning electron microscope (SEM). FIG. 4 is a view illustrating an SEM observation photograph of the conductor layer 20 according to Example.

As illustrated in FIG. 4, in the wiring board 1 of Example, the conductor layer 20 is made of a sintered body of a plurality of crystallites 24 containing a metal as a main component. In the wiring board 1 of Example, it can be seen that the conductor layer 20 has a layered structure in which the dense layer 21, the non-dense layer 22, and the dense layer 23 are layered in a layered manner.

When the dense layer 21, the non-dense layer 22, and the dense layer 23 were designated from the conductor layer 20, a straight line parallel to the main surface of the insulation layer 10 was applied in parallel to an arbitrary position of the conductor layer 20, and the dense layers 21 and 23 and the non-dense layer 22 were visually designated. In this case, the difference in thickness between the dense layers 21 and 23 located above and below the non-dense layer 22 was 1 (μm) or less.

In the produced wiring board 1, as illustrated in FIG. 4, since the thickness of the conductor layer 20 was different in the longitudinal direction (the direction of the interface between the insulation layer 10 and the conductor layer 20 in FIG. 4), the conductor layer 20 was divided so as to have a thickness of 1 (μm) or less, and the dense layers 21 and 23 and the non-dense layer 22 were identified from the divided portions. The porosity of each layer was determined by image analysis of a photograph taken with an electron microscope.

Although not illustrated, in the wiring board 1 of Reference Example, the conductor layer 20 did not have a layered structure in which the dense layer 21, the non-dense layer 22, and the dense layer 23 were layered.

That is, in the present disclosure, it is presumed that the addition of both the silica particles and the glass powder to the conductive paste promotes the formation of the void 25 in the central portion of the conductor layer 20 in the thickness direction.

Using the SEM observation photographs obtained as described above, the ratio L1/L0 of the length L1 of the contour 20a of the conductor layer 20 to the linear length L0 in the planar direction in Example and Reference Example were measured.

To be specific, first, points A and B were attached to both ends of one contour 20a of the conductor layer 20 illustrated in the cross-sectional photograph, a straight line was drawn between the points A and B, and the length of the straight line was set as the L0. The image processing apparatus was used to determine the length of the contour 20a from point A to point B, and this length was used as the L1. Finally, L1/L0, as the ratio of both lengths, was determined.

When the number of sides of the plurality of crystallites 24 in Example was evaluated using the SEM observation photograph obtained as described above, it was confirmed that the number ratio of crystallites 24 having two or more linear sides was 70(%) or more.

The interface electrical conductivity of the wiring board 1 of Example and Reference Example obtained as described above were measured. The interface electrical conductivity was measured by a cylindrical dielectric resonator method described below. As a sample for measurement, a sample having a diameter of 50 (mm) in which the conductor layer 20 was formed over substantially the entire surface of both surfaces was used.

The method of measuring interface electrical conductivity by using the cylindrical dielectric resonator method is a method of measuring electrical conductivity at the interface between a conductor and an insulation layer, i.e., at the conductor interface, by attaching an insulation layer having the conductor formed therein to both end faces or one end face of a dielectric cylinder made of a dielectric material having known relative permittivity and dielectric loss such that a predetermined relationship is established and thereby forming a dielectric resonator.

The principle of this measurement method is based on the fact that when conductor plates large enough to ignore a cut-edge effect (usually, conductor plates having a diameter D of about three times a diameter d of the dielectric cylinder) are placed in parallel on both end surfaces of the dielectric cylinder having a predetermined dimensional ratio (height h/diameter d) and supported thereon to form an electromagnetic field resonator, a high-frequency current flowing through the conductor plates in the TEomn resonance mode (hereinafter, referred to as the TEomn mode) is distributed only on the short-circuited surface, i.e., the facing surface between the dielectric body and the conductor.

In the dielectric resonator, by using the fact that the high-frequency current flowing through the conductor due to the TEomn mode (m=1, 2, 3, . . . , n=1, 2, 3, . . . ) is distributed only at the interface between the conductor and a dielectric board in contact with the dielectric cylinder, interface electrical conductivity can be calculated from the measured resonance frequencies f0 of the TEomn mode (m=1, 2, 3, . . . , n=1, 2, 3, . . . ) and no-load Q, Qu. The interface electrical conductivity was measured at a frequency of 10 (GHz).

The adhesion between the insulation layer 10 and the conductor layer 20 in each wiring board 1 of Example and Reference Example obtained above was evaluated by a temperature cycle test. In this temperature cycle test, the maximum temperature was set to 125 (° C.), the minimum temperature was set to −55 (° C.), and 1000 cycles were performed under the condition that the temperature was changed for 30 seconds after each of the maximum temperature and the minimum temperature was left for 30 minutes. For the samples after the temperature cycle test, the presence or absence of peeling between the insulation layer 10 and the conductor layer 20 was confirmed.

Table 1 illustrates the contents of the silica particles and the glass powder in the conductor layer 20, the value of L1/L0 in the conductor layer 20, the areal proportion of the silica particles in the conductor layer 20, the measurement result of the interface electrical conductivity at a frequency of 10 (GHz), and the evaluation result of the adhesion in Example and Reference Example. The measurement result of the interface electrical conductivity at a frequency of 10 (GHz) is a relative value when the interface electrical conductivity in direct current is 100(%).

TABLE 1

|  | EXAMPLES | REFERENCE EXAMPLE |
| --- | --- | --- |
| Glass powder content | 1 (wt %) | 1 (wt %) |
| Silica particle content | 1 (wt %) | Not added |
| L1/L0 | 1.05 | 1.06 |
| Interface electrical conductivity (10 GHz) | 89(%) | 88(%) |
| Adhesion evaluation | No peeling | Peeling |

Table 1 illustrates the results. The conductor layer 20 of Example in Table 1 had a layered structure in which the dense layer 21, the non-dense layer 22, and the dense layer 23 were layered in layers, but the conductor layer 20 of Reference Example had a microstructure corresponding to the dense layers 21 and 23 as a whole. As in Examples shown in Table 1, it is found that peeling between the insulation layer 10 and the conductor layer 20 can be reduced by forming the conductor layer 20 to have a layered structure in which the dense layer 21, the non-dense layer 22, and the dense layer 23 are layered in a layered manner.

As shown in Table 1, it is found that the interface electrical conductivity of the conductor layer 20 can be increased to 89(%) by setting the value of L1/L0 in the conductor layer 20 in a range of 1.04 to 1.14. The produced conductor layer 20 of Example contained silica particles. The conductor layer 20 had a structure in which the plurality of crystallites 24 included polygonal crystallites 24 including a linear side, and the sides were in contact with each other as grain boundaries. When the conductor layer 20 was evaluated by dividing the value of L1/L0 in the longitudinal direction, the mean value was 1.05 as shown in Table 1, but the conductor layer 20 had individual portions showing values from 1.04 to 1.14.

Although an embodiment of the present disclosure has been described above, the present disclosure is not limited to the embodiment described above, and various changes can be made without departing from the spirit of the present disclosure. For example, in the above-described embodiment, the example in which the fine powder of the silica particles is added to the conductive paste which is the raw material of the conductor layer 20 has been described, but the present disclosure is not limited to such an example.

For example, ceramic fine powder other than silica (for example, alumina fine powder) may be added to the electrically conductive paste. In this case as well, effects the same as or similar to those in the embodiment described above can be obtained.

Additional effects and other aspects can be easily derived by a person skilled in the art. Thus, a wide variety of aspects of the present disclosure are not limited to the specific details and representative embodiments represented and described above. Accordingly, various changes are possible without departing from the spirit or scope of the general inventive concepts defined by the appended claims and their equivalents.

The invention claimed is:

1. A wiring board comprising:
an insulation layer made of ceramic; and
a conductor layer extending in a planar direction inside the insulation layer, the conductor layer being constituted by a sintered body of a plurality of crystallites containing a metal as a main component, and having a layered structure in which a dense layer, a non-dense layer, and a dense layer are layered in layers in this order in a thickness direction of the conductor layer,
wherein the conductor layer contains silica particles,
wherein the silica particles are present on a surface of the conductor layer.

2. The wiring board according to claim 1, wherein L1/L0 is in a range of 1.04 to 1.14 when a specific range of the conductor layer is specified in a cross-sectional view, L0 is a linear length in the planar direction, and L1 is a length of a contour of the conductor layer.

3. The wiring board according to claim 1, wherein the sintered body comprises a silica particle having a diameter of 1 nanometers (nm) to 50 nanometers (nm).

4. The wiring board according to claim 1, wherein the plurality of crystallites contain copper as a main component, and the plurality of crystallites comprise a polygonal crystallite having a side being linear, each of the plurality of crystallites being in contact with each other along the side as a grain boundary.

5. The wiring board according to claim 4, wherein the plurality of crystallites comprise, at a ratio of a number of crystallites, 70(%) or more of the plurality of crystallites each having two or more sides that are the side.

6. The wiring board according to claim 1, wherein the silica particles are present to be isolated from each other.

* * * * *